United States Patent [19]

Goveas

[11] Patent Number: 5,386,211
[45] Date of Patent: Jan. 31, 1995

[54] METHOD AND APPARATUS FOR RECORDING AND RECONSTRUCTING BINARY DATA IN A COMPRESSED FORM

[75] Inventor: Melvyn A. Goveas, Folsom, Calif.

[73] Assignee: Intel Corporation, Santa Clara, Calif.

[21] Appl. No.: 128,875

[22] Filed: Sep. 29, 1993

[51] Int. Cl.⁶ .............................................. H03M 7/30
[52] U.S. Cl. ..................................................... 341/51
[58] Field of Search .................. 341/50, 51, 87, 95, 341/106; 364/200

[56] References Cited

U.S. PATENT DOCUMENTS 5,293,164  3/1994  Bugajski et al. ........................ 341/51

Primary Examiner—Brian K. Young
Attorney, Agent, or Firm—Blakely, Sokoloff, Taylor & Zafman

[57] ABSTRACT

An effective method and apparatus for compressing binary data with little processor overhead. The input string of binary data is read into a buffer, where it is then analyzed to determine if a pattern exists. If a pattern does exist, the pattern value is determined and stored in a list, with a length value indicative of the number of sequential occurrences of the pattern. Thus, repeatable patterns are stored simply by increasing the length parameter. Preferably, the list accommodates both patterns and single binary values which can be stored in a store-on-change format. The resulting data structure provides an entry for a pattern value or a binary value as well as a length value which identifies the number of repetitions of the pattern or binary value.

28 Claims, 4 Drawing Sheets

# METHOD AND APPARATUS FOR RECORDING AND RECONSTRUCTING BINARY DATA IN A COMPRESSED FORM

BACKGROUND OF THE INVENTION

1. Field of the Invention

The present invention relates to the storage of binary data in a compressed form. More particularly, the present invention relates to the storage and access of binary data for subsequent generation on a display.

2. Art Background

Binary data, such as that representative of a graphical or pixel image, or data representative of a Signal wave form, is typically stored in one of two ways. In a first method, the binary values are simply stored in a buffer or memory. Although advantageous due to its simplicity of implementation, as the size of the binary stream increases so does the amount of memory required to store the information. Therefore, it is typically preferred to store the binary stream in a compressed form.

One widely used compressed format is referred to as the store-on-change format. This format is effective for highly repetitive binary data. In a system which utilizes a store-on-change format, an entry in a list is created each time the state of the binary data changes. A parameter associated with each entry identifies the length of the binary string for a particular data value. Although this format works well with data which consists of long strings of constant binary data values, the amount of memory needed to store a rapidly or frequently changing binary string is quite significant.

As is well known in the art, other data compression techniques have been developed to save on the amount of memory required to store the data. However, these techniques can be quite complex and require significant processing overhead.

SUMMARY OF THE INVENTION

It is therefore an object of the present invention to provide a simple, straightforward process and apparatus or implementation of the same, for storing binary data in a compressed form, and subsequently retrieving the stored compressed data for regeneration of the data for display.

It is further an object of the present invention to provide a system which stores binary strings in compressed form with little overhead realized.

In the process of the present invention, the input data, which consists of a string of binary data, is stored temporarily in a buffer of a pre-determined size. When a count indicating a pre-determined number of bits have been read into the buffer, the bits are examined to determine the number of transitions which occurred in the group of bits for the present count. If more than one transition has occurred, a pattern is tagged and a pattern code is generated which represents the pattern. The pattern code is then stored in a list, preferably a linked list, and identified to have a length of one. The counter is then reset and the next stream of input data is read into the buffer.

If the pattern detected subsequently is the same as the previous pattern recorded in the linked list, the length parameter of that previous node of the list is simply incremented by one, to indicate the repetition of the pattern.

If a pattern is not detected in the input string, then the input string is stored in an alternate format, such as an alternative compression format. Preferably, a store-on-change format node is generated.

In a preferred embodiment, the data structure of each node of the link list is similar to that of the store-on-change format. However, an additional parameter is added to identify a pattern code, if applicable. Thus, if a pattern is represented, the pattern code is provided at the node and the change parameter indicative of the non-pattern value is set to a null value, to indicate that the node identifies a pattern.

If no pattern is determined, the string is stored in the store-on-change format. Thus, the change parameter of the nodes generated to represent the input string is set to the value indicative of the state of the input string. In addition, the pattern code parameter is set to a null value. This format provides great flexibility, enabling both pattern and non-pattern data to be compressed in some form to save on memory space.

Preferably, the method and apparatus of the present invention is used to store signal wave forms, recorded and stored in memory for subsequent display on a graphics display device or for output to another processing device. For wave forms representative of repeated patterns such as clock signals, the compression factor is quite significant, with little processing overhead incurred during storage and retrieval of the data for display.

BRIEF DESCRIPTION OF THE DRAWINGS

The objects, features and advantages of the present invention will be apparent to one skilled in the art from the following detailed description, in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the invention. In other instances, well known electrical structures and circuits are shown in block diagram form in order not to obscure the present invention unnecessarily.

Figure 1:
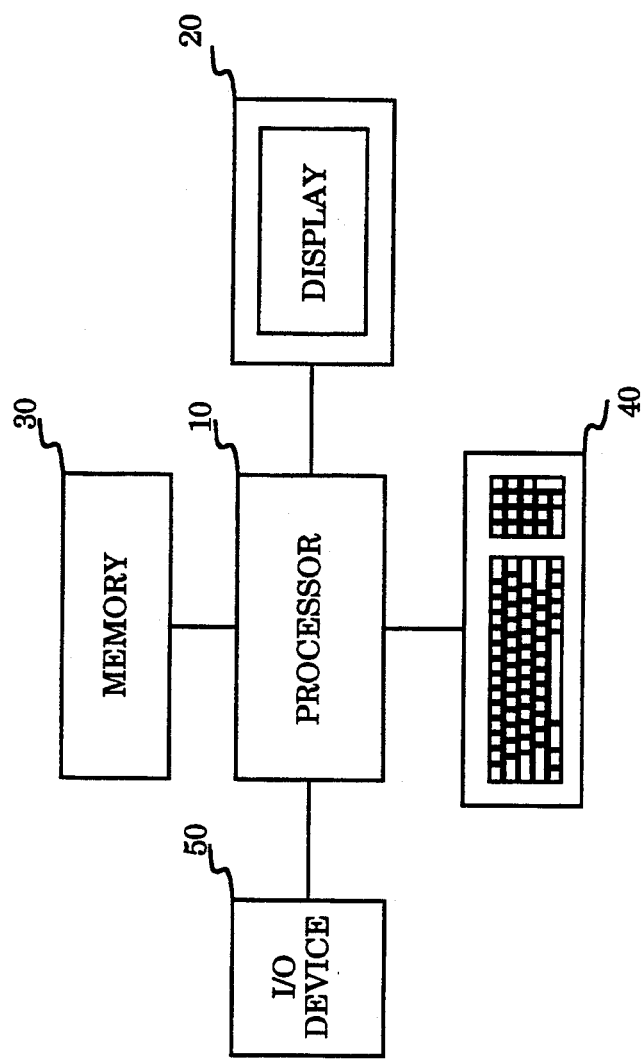
FIG. 1 is a block diagram representation of a system utilizing the method and apparatus of the present invention.

An illustrative system which incorporates present invention shown in FIG. 1. Processor 10 is coupled to a plurality of devices, such as memory 30, and input/output devices, such as keyboard 40 and display 20. The display device 20 preferably displays a graphical image of the binary data, stored in accordance with the teachings of the present invention. The binary data maybe input to the system using a variety of means, such as I/O device 50, for example a signal wave form detector or logic analyzer, which detects signals generated by a component on a signal line and generates a digital or binary representation of the wave form.

Figure 2:
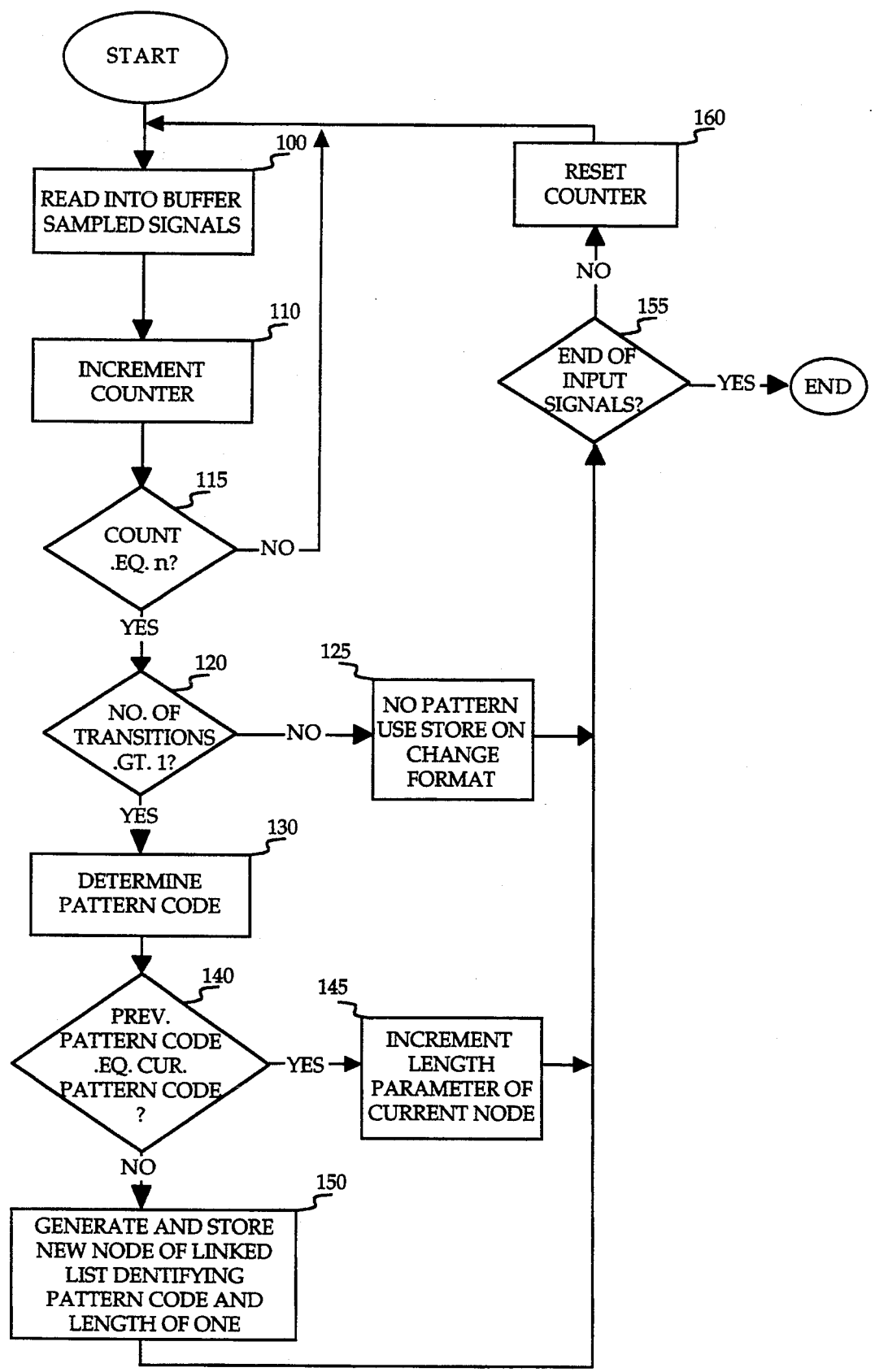
FIG. 2 is a flowchart which sets forth one embodiment of the process of the present invention.

The data input is then stored in accordance with the teachings of the present invention in memory, such as memory 30, and subsequently, accessed and displayed on display device 20. It is readily apparent to one skilled in the art that the teachings provided herein can be used for other purposes aside from the storage of wave forms. The process of the present invention will now be described with reference to the embodiment set forth in the flow diagram of FIG. 2.

A buffer is allocated for storage. In one embodiment, the size of the buffer is set to a pre-determined amount to store the number of samples of a signal which comprise one pattern. A count is maintained to track the number of samples input to the system. Although the present discussion is directed to samples of one signal, it is readily apparent that the process can be expanded to multiple signals. At Step 100, a sample signal is read into the buffer and stored temporarily. At Step 110, the counter is incremented. A check is then made to determine if the count equals the number of samples used to form a pattern.

At step 115, if the count does not equal the pre-determined number of samples, the process returns to step 100 to read in the next sampled signal into the buffer. Thus, once the buffer contains a number of sample signals which correspond to the length of a pattern, the sequence of binary data stored in the buffer is checked to determine if a pattern exists.

In the present embodiment, the number of transitions between states is counted and if the number of transitions is greater than a determined minimum number of transitions, for example one, a pattern is tagged or declared. Although in the present illustration a pattern is tagged if there is a minimum of one transition in the group of samples, it may be desirable, depending upon the application, to increase the minimum number of transitions detected before a pattern is tagged. In the present embodiment, if the number of transitions is less than or equal to one, at step 125, no pattern is detected and the sequence of bits is stored in an alternate format, such as the store-on-change format described. If a pattern is tagged, then the corresponding pattern code is then determined, step 130.

It is readily apparent that a number of different codings may be used to represent the pattern of the sequence of bits. In the present embodiment, the code is identified according to its digital value, corresponding to the binary sequence. Thus, for example, pattern code 0 corresponds to pattern 00000000. Similarly, pattern code 1 corresponds to pattern 00000001 and pattern code 2 corresponds to pattern 0000010.

Once the pattern code is determined, at step 140, the prior entry in the list or node is checked to determine if the current pattern code is the same as the previous pattern code stored. If it is, substantial storage savings is realized by incrementing a length parameter for that node to indicate the presence of the pattern. Thus, instead of storing two sequences of identical patterns, one sequence with a length value of two is stored.

If the previous pattern stored is not the same as the current pattern, then a new node is generated, step 150, identifying the pattern code and the length or number of repetitions of the code. The new node is stored at the end of the list. Preferably, a linked list is used in which an additional parameter of the node is a pointer to the next node in the list.

The process continues until the end of the input if reached, step 155. For each group of bits, the counter is reset, step 160, such that a new group of input signals are read into the buffer, step 100, and processed accordingly.

Figure 3A:
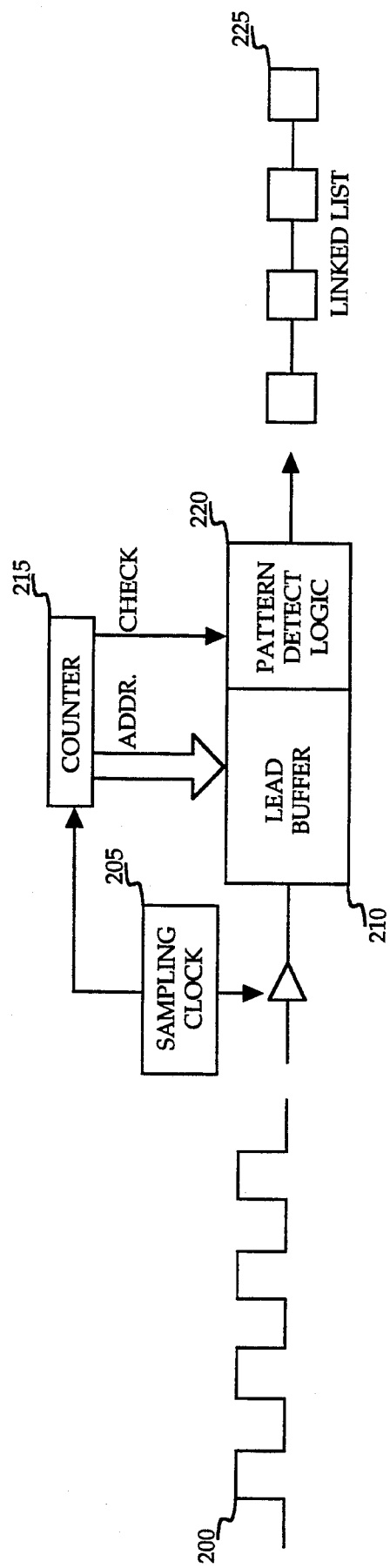
FIG. 3a is a block diagram representation of one embodiment of the apparatus of the present invention.

A block diagram representation of one embodiment of the apparatus of the present invention is shown in FIG. 3a. It is readily apparent that other structures may be used to store and retrieve data in accordance with the present invention. The input string 200 is sampled in accordance with sampling clock 205 to store digital data in the lead buffer 210. Sampling clock 205 further drives the counter 215, which maintains a count of the number of bits stored in the Buffer 210 and also provides an address to the buffer elements stored.

When the counter 215 reaches the pre-determined value indicative of a pattern length, a signal, referred to herein as "check", is issued to the pattern detect logic 220. Preferably, the pre-determined value "n" is set to a value which is equals the width of the buffer. Thus, for example, if n=8, the buffer 210 is of a size to store 8 pieces of digital data. However, it is readily apparent that the buffer 210 could be of a larger size to store multiple sequences of data as well as strings of varying sizes.

Figure 3B:
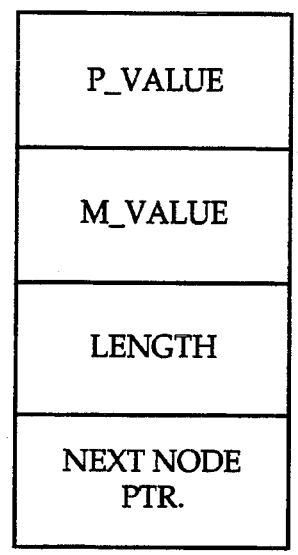
FIG. 3b is a block diagram representation of an illustrative linked list utilized in the preferred embodiment of the present invention.

The pattern detect logic 220, upon receiving the check signal from counter 215, examines the string of data in the buffer 210 to determine if a pattern exists and, if one does exist, whether the pattern is the same as the previous pattern stored in the list. The output of the pattern detect logic 220 forms a list 225, identifying the signal input 200. Preferably, the data structure is in the form of a linked list such as that shown in FIG. 3b. FIG. 3b represents a single node or element of the linked list.

In the present embodiment, the node includes four parameters to accommodate both pattern and store-on-change format information. The p value 250 is used to store the pattern value determined for the current string of binary values in the buffer. As mentioned above, the p value 250 can take on a variety of forms, depending upon the application. The m value 255 is utilized if a pattern is not detected. This stores the store-on-change value for a particular bit of data. Thus, in the present embodiment, either the p value 250 or the m value 255 would be used for any node; the one not in use is set to a pre-determined null value and therefore indicates whether the node contains a pattern value or a simple store-on-change bit value.

The length parameter 260 is used to identify the number of bits for a store-on-change format or the number of sequential patterns which are the same. For repeatable patterns, this represents a significant savings in space with very little overhead in order to process the sequences. Preferably, a next pointer is provided, 265, to point to a location in memory of the next node of the linked list. Thus, this data structure provides a flexible format for compressing data when patterns exist, as well as for compressing data.

In the present embodiment, the length of the string, n, is set to a pre-determined value equal to the size of the buffer. However, in alternate embodiments, n could be set to a different or varying value. For example, in an alternate embodiment, an additional parameter for each node is provided. The additional parameter identifies the number of bits in the current pattern string. If patterns of varying lengths are included in the input string, or if the length of patterns vary from input data to input data, this embodiment accommodates those changes and variations. Thus, a simple but effective way for storing binary strings of data in compressed form is provided.

To retrieve uncompressed data for subsequent use, such as displaying the binary strings on a display device or outputting the data to another device for subsequent processing or analysis, the reverse process is implemented. Thus the linked list is accessed and each node in sequence is read. From the values of the p value, m value and length value, the pattern or bit value and the number of times the pattern or bit value is repeated are determined, and the corresponding binary string generated. The next node pointer points to each subsequent node in the length list, so that all the data is retrieved.

The present invention has been described in conjunction with the preferred embodiment. It is evident that numerous alternatives, modifications, variations and uses will be apparent to those skilled in the art in light of the foregoing description.

What is claimed is:

1. A method for storing binary data, each bit of data having a first state or second state, said method comprising the steps of:

receiving a string of binary input data;
    incrementing a count for each bit of data received;
    reviewing the received binary input data when the count reaches a determined count value n to determine the number of transitions between a first and second state and the position of the transitions in the string;
    if the number of transitions is greater than a minimum number of transitions indicative of a pattern,
        determining a pattern code for the string of binary input data,
        accessing a previous output node of a list containing a previous pattern code representative of a previous string of input data,
        if the pattern code in the previous output node is equal to the pattern code of determined, incrementing the previous output node's length parameter by one, said length parameter identifying the number of sequential repetitions of the pattern identified by the pattern code, and
        if the pattern code in the previous output node is not equal to the pattern code of determined, generating a pattern node to add to the stored list, said node comprising the pattern code and the length of the parameter, set initially to a value of one;
    if the number of transitions is less than/equal to the minimum number of transitions, generating at least one bit node to add to the stored list, each bit node sequentially identifying the state of the bits and the number of sequential occurrences of the same state in string of binary input data;
    wherein the amount of data required to store the input binary data is decreased.

2. The method as set forth in claim 1, wherein the step of generating at least one bit node comprises generating nodes in accordance with store-on-change format.

3. The method as set forth in claim 1, further comprising the step of retrieving the stored data, comprising the steps of:

reading the list of nodes,
    for each node, determining the pattern code or bit state and length values; and
    generating uncompressed binary data by generating as output the pattern of binary values represented by the pattern code or bit state identified in the node a number of times identified by the length value;
    wherein the compressed stored data is retrieved and regenerated.

4. The method as set forth in claim 1, wherein the list is a linked list and said method further comprises the steps of generated a linked list pointer value which points to the location of the next subsequent node in the linked list, the last node in the list comprises a null pointer value.

5. The method as set forth in claim 1, wherein a node comprises a pattern value field, a bit value field and length field, if a node is generated, said method further comprising the steps of:

if the number of transitions is greater than the minimum number of transitions, setting the bit value field to a null value to indicate that the node comprises a pattern value; and
    if the number of transitions is less than/equal to the minimum number of transitions, setting the pattern value field to a null value to indicate that the node comprises a bit value.

6. The method as set forth in claim 1, wherein the count value n is varied, said method further comprising the steps of setting a count value field in each node to the count value for the string represented by the node.

7. The method as set forth in claim 6, further comprising the step of modifying the count value n if a pattern is found to occur in a string of a length greater than or less than the current value of n.

8. The method as set forth in claim 1, wherein the minimum number of transitions equals one.

9. An apparatus for storing compressed binary data comprising:

input means for receiving binary data, each bit of data having a first or second state;
    a buffer for temporarily storing at least one string of binary data of a length n;
    a counting means for maintaining a count of bits stored in the buffer;
    pattern detect means coupled to the counting means and the buffer for examining the string of data stored in the buffer when the count of bits equals n, said pattern detect means comprising;
    means for determining the number of transitions between states in the string of bits;
    if the number of transitions is greater than a minimum number of transitions,
    means for determining a pattern code according to the pattern of transitions in the string of binary input data,
    means for accessing a previous output node of a list containing a previous pattern code representative of a previous string of input data,
    if the pattern code in the previous output node is equal to the pattern code of determined, means for incrementing the previous output node's length parameter by one, said length parameter identifying the number of sequential repetitions of the pattern identified by the pattern code, and
    if the pattern code in the previous output node is not equal to the pattern code determined, means for generating a pattern node to add to the stored list, said node comprising the pattern code and the length of the parameter, set initially to a value of one; and
    if the number of transitions is less than/equal to the minimum number of transitions, means for generating at least one bit node to add to the stored list, each bit node sequentially identifying the state of the bits and the number of sequential occurrences of the same state in string of binary input data;

wherein the amount of data required to store the input binary data is decreased.

10. The apparatus as set forth in claim 9, further comprising a means for retrieving the stored data, comprising:

means for reading the list of nodes, for each node, means determining the pattern code or bit state and length values; and output means for generating uncompressed binary data by generating as output the pattern of binary values represented by the pattern code or bit state identified in the node a number of times identified by the length value;

wherein the compressed stored data is retrieved and regenerated.

11. The apparatus as set forth in claim 10, further comprising:

a display for displaying binary data; and display control means for displaying on the display the regenerated data.

12. The apparatus as set forth in claim 9, wherein the minimum number of transitions equals one.

13. The apparatus as set forth in claim 9, wherein the list is a linked list and each node of the linked list further comprises a linked list pointer value which points to the location of the next subsequent node in the linked list, the last node in the list comprises a null pointer value.

14. The method as set forth in claim 9, wherein the bit node is generated in accordance with the store-on-change format.

15. The apparatus as set forth in claim 9, wherein each node comprises a pattern value field, a bit value field and length field, wherein:

if the number of transitions is greater than one, the bit value field is set to a null value to indicate that the node comprises a pattern value; and if the number of transitions is less than/equal to one, the pattern value field is set to a null value to indicate that the node comprises a bit value.

16. The apparatus as set forth in claim 9, wherein the count value n is varied, said apparatus further comprising a means for setting a count value field in each node to the count value for the string represented by the node.

17. The apparatus as set forth in claim 16, further comprising means for modifying the count value n if a pattern is found to occur in a string of a length greater than or less than the current value of n.

18. An apparatus for storing compressed binary data comprising:

an input port for receiving binary data, each bit of data having a first or second state;

memory for temporarily storing at least one string of binary data of a length n;

a counter for maintaining a count of bits stored in the buffer;

pattern detect logic coupled to the counting means and the buffer for examining the string of data stored in the buffer when the count of bits equals n, said pattern detect logic comprising;

a level detector for determining the number of transitions between states in the string of bits;

if the number of transitions is greater than a minimum number of transitions, said pattern detect logic comprising, a comparator for determining a pattern code according to the pattern of transitions in the string of binary input data, data accessing means for accessing a previous output node of a list containing a previous pattern code representative of a previous string of input data, if the pattern code in the previous output node is equal to the pattern code of determined, an incrementor for incrementing the previous output node's length parameter by one, said length parameter identifying the number of sequential repetitions of the pattern identified by the pattern code, and if the pattern code in the previous output node is not equal to the pattern code determined, means for generating a pattern node to add to the stored list, said node comprising the pattern code and the length of the parameter, set initially to a value of one; and if the number of transitions is less than/equal to the minimum number of transitions, means for generating at least one bit node to add to the stored list, each bit node sequentially identifying the state of the bits and the number of sequential occurrences of the same state in string of binary input data;

wherein the amount of data required to store the input binary data is decreased.

19. The apparatus as set forth in claim 18, wherein the minimum number of transitions is equal to one.

20. The apparatus as set forth in claim 18, further comprising a means for retrieving the stored data, comprising:

means for reading the list of nodes, for each node, a comparator and level detector for determining the pattern code or bit state and length values; and output means for generating uncompressed binary data by generating as output the pattern of binary values represented by the pattern code or bit state identified in the node a number of times identified by the length value;

wherein the compressed stored data is retrieved and regenerated.

21. The apparatus as set forth in claim 20, further comprising:

a display for displaying binary data; and display control means for displaying on the display the regenerated data.

22. The apparatus as set forth in claim 18, wherein the list is a linked list and each node of the linked list further comprises a linked list pointer value which points to the location of the next subsequent node in the linked list, the last node in the list comprises a null pointer value.

23. The apparatus as set forth in claim 18, wherein each node comprises a pattern value field, a bit value field and length field, wherein:

if the number of transitions is greater than one, the bit value field is set to a null value to indicate that the node comprises a pattern value; and if the number of transitions is less than/equal to one, the pattern value field is set to a null value to indicate that the node comprises a bit value.

24. The apparatus as set forth in claim 18, wherein the count value n is varied, said apparatus further comprising a means for setting a count value field in each node to the count value for the string represented by the node.

25. The apparatus as set forth in claim 24, further comprising means for modifying the count value n if a pattern is found to occur in a string of a length greater than or less than the current value of n.

26. The apparatus as set forth in claim 18, wherein said means for generating at least one bit node generates a node in accordance with store-on-change format.

27. In a system comprising a central processing unit (CPU), memory, a display device and at least one input-/output device, an apparatus for storing a binary stream representative of an input signal, comprising:
- a buffer located in the memory for temporarily storing at least one string of binary data representative of a portion of the input signal;
- a counter for maintaining a count of bits stored in the buffer;
- pattern detect logic coupled to the counting means and the buffer for examining the string of data stored in the buffer when the count of bits equals n, said pattern detect logic comprising;
- a level detector for determining the number of transitions between states in the string of bits;
  if the number of transitions is greater than a minimum number of transitions, then
- a comparator for determining a pattern code according to the pattern of transitions in the string of binary input data,
- data accessing means for accessing a previous output node of a list stored in the memory containing a previous pattern code representative of a previous string of input data,
- if the pattern code in the previous output node is equal to the pattern code of determined, an incrementor for incrementing the previous output node's length parameter by one, said length parameter identifying the number of sequential repetitions of the pattern identified by the pattern code, and
- if the pattern code in the previous output node is not equal to the pattern code determined, means for generating a pattern node to add to the stored list, said node comprising the pattern code and the length of the parameter, set initially to a value of one; and if the number of transitions is less than/equal to the minimum number of transitions, means for generating at least one bit node to add to the stored list, each bit node sequentially identifying the state of the bits and the number of sequential occurrences of the same state in string of binary input data;
- wherein the amount of data required to store the input binary data in memory is decreased.

28. The apparatus as set forth in claim 27, further comprising a means for retrieving and displaying the stored data, comprising:
- means for reading the list of nodes,
- for each node, a means for determining the pattern code or bit state and length values; and
- output means for generating uncompressed binary data by generating as output the pattern of binary values represented by the pattern code or bit state identified in the node a number of times identified by the length value; and
- display control means for displaying on the display the regenerated data.

* * * * *